United States Patent [19]

Saul et al.

[11] 4,001,703

[45] Jan. 4, 1977

[54] TRANSMISSION LINE INTERFACE CIRCUIT

[75] Inventors: Glenn Saul, Ambler; Philip W. Bur, Horsham, both of Pa.

[73] Assignee: Honeywell Inc., Minneapolis, Minn.

[22] Filed: Oct. 20, 1975

[21] Appl. No.: 623,958

[52] U.S. Cl. .............................. 330/1 A; 330/28; 330/105

[51] Int. Cl.[2] ........................................ H03F 1/34

[58] Field of Search ............ 330/1 A, 28, 30 D, 69, 330/75, 105; 307/DIG. 1; 318/678, 679, 681

[56] References Cited

UNITED STATES PATENTS 3,696,304   10/1972   Fricke ............................ 330/69 X

OTHER PUBLICATIONS

Trietley, "Voltage-to-Current Converter for Process-Control Systems," *Electronics*, Apr. 26, 1973, p. 102.

*Primary Examiner*—James B. Mullins
*Attorney, Agent, or Firm*—Lockwood D. Burton; Laurence J. Marhoefer

[57] ABSTRACT

An interface circuit for a transmission line between a remote transmitter and a central control room instrument includes an operational amplifier. The input of the operational amplifier is derived from the current drawn by the remote transmitter. The output signal of the operational amplifier is applied to control the operation of a transistor current controlling amplifier. The current controlled by the transistor amplifier is drawn from the same source as the current drawn by the transmitter. Because of a feedback connection from the transistor amplifier to the input of the operational amplifier, the output current from the transistor amplifier is a mirror image of current drawn by the transmitter. With that arrangement, both the power supply and the remote transmitter may be grounded without loss of accuracy or reliability.

6 Claims, 1 Drawing Figure

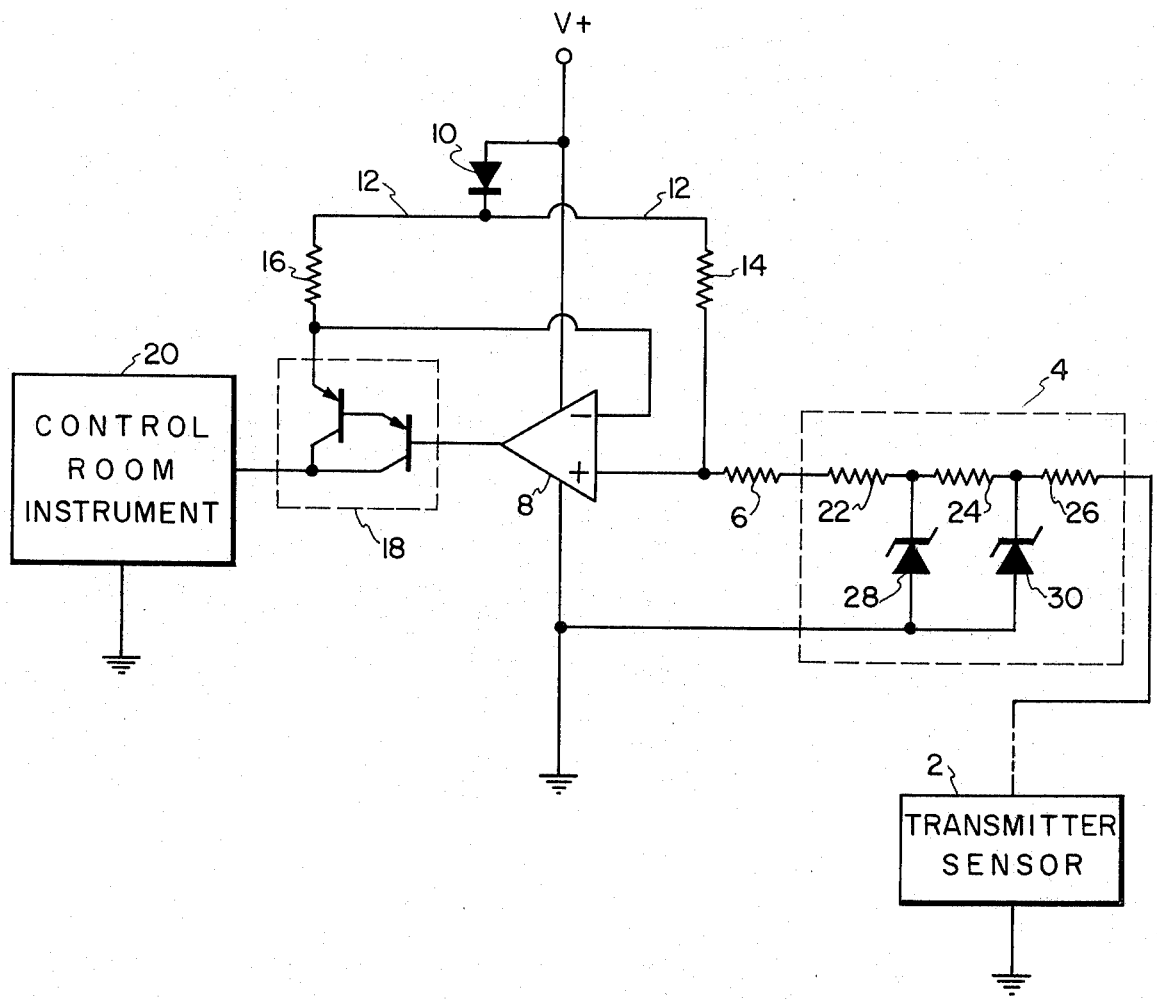

TRANSMISSION LINE INTERFACE CIRCUIT

BACKGROUND OF THE INVENTION

1. Field of the Invention

The present invention relates to transmission means, and more particularly, to a transmission line interface circuit.

2. Description of the Prior Art

In the art of industrial process control, it is common for a process sensor together with its transmitter to be located at a significant distance from a central control room. It is also common for the sensor/transmitter to be energized by a power source located at the control room. In order to provide reliable transmission of data from the sensor to the control room, communication between the control room and the remote sensor/transmitter is by way of a two-wire transmission line. It would be preferable, for several reasons, if both the energizing power supply and the transmitter were to be grounded. However, since so-called ground potential may not be the same for two widely separated instrumentalities, a simple ground connection at such two widely separated instrumentalities would tend to produce an error in the analog data transmitted.

SUMMARY OF THE INVENTION

It is, accordingly, an object of the present invention to provide an interface circuit whereby a grounded transmitter and a grounded power supply may be employed.

It is another object of the present invention to provide an interface circuit as set forth wherein a controlled mirror current is developed whereby to provide accurate transmission of analog data between a transmitter and a control room.

In accomplishing these and other objects, there has been provided, in accordance with the present invention, an interface circuit including an operational amplifier, the input to which is derived from the sensor/transmitter and the output of which is a controlled current which is a mirror image of the current supplied to the transmitter from the power supply.

BRIEF DESCRIPTION OF THE DRAWINGS

A better understanding of the invention may be had from the following detailed description when read in the light of the accompanying drawing in which:

The single figure is a schematic diagram of a transmission line interface circuit embodying the present invention.

DESCRIPTION OF THE PREFERRED EMBODIMENT

In the figure there is shown a transmitter/sensor 2, one terminal of which is connected to ground. The other terminal of the transmitter/sensor 2 is connected through an intrinsic safety barrier 4 and a series resistor 6 to one input terminal of an operational amplifier 8. In the illustrative example, the transmitter connection is to the non-inverting input terminal of the amplifier 8. A power supply terminal V+ is connected to energize the amplifier 8 directly. The other energization terminal of the amplifier 8 is connected directly to ground. The power supply V+ is also connected through a diode 10 to a common bus 12. The bus 12 is connected through a resistor 14 to the non-inverting input terminal of the amplifier 8, the same terminal to which the transmitter/sensor 2 is connected. The bus 12 is also connected through a resistor 16 to the emitter electrode of a transistor Darlington pair 18. The base electrode of the Darlington pair 18 is connected to the output terminal of the amplifier 8. The collector electrode of the Darlington pair 18 is, in turn, connected to the input of the control room instrumentation, and constitutes the output terminal of the interface circuit.

The intrinsic safety barrier 4 is conventional in form and includes a series of resistors 22, 24 and 26 and a pair of zener diodes 28, 30 connected, respectively, to the junctions between the resistors 22 and 24 and the junction between the resistors 24 and 26. The anode terminals of the two zener diodes are connected together and to ground.

The junction between the resistor 16 and the emitter of the Darlington pair 18 is connected in feedback relation to the inverting input terminal of the amplifier 8.

In operation, the current controlled by the transmitter/sensor 2 is drawn from the power supply V+ through the diode 10 and the bus 12, through the resistor 14, the resistor 6 and the resistors 22, 24 and 26 of the safety barrier 4. The junction between the resistors 14 and 6, as noted above, is connected to the non-inverting input of the amplifier 8. Thus, one input signal to that amplifier 8 is the voltage developed across the resistor 14. The output of the amplifier 8, connected to the Darlington pair 18, controls, in turn, the amount of current flowing from the power supply V+ through the diode 10 and the resistor 16. Since the junction between the resistor 16 and the emitter of the Darlington pair 18 is connected to the inverting input of the amplifier 8, the voltage drop across the resistor 16 becomes the other input signal to the amplifier 8. Since the amplifier 8 is connected as an operational amplifier, the controlled current through the resistor 16 tends to produce a voltage drop across the resistor 16 which is equal to the voltage drop across the resistor 14, thereby equalizing the input signals to the two input terminals of the amplifier 8. Inasmuch as the current drawn through the resistor 16 by the Darlington pair 18 constitutes the output current of the interface circuit, the current from the interface circuit to the control room instrument 20 is a mirror image of the current drawn by the transmitter/sensor 2. That is, the current flowing from the source V+ through the diode 10 to the transmitter 2 will be equal to or proportional to the current drawn from the source V+ through the diode 10 to the control room instrument 20. The two currents will be reliably equal if the resistors 14 and 16 are equal, notwithstanding the relative remoteness of the two ground terminals.

The diode 10 provides, substantially a temperature compensation for the thermal characteristics of the Darlington pair 18.

One of the principal advantages of the arrangement herein presented is the ability to effect intrinsic safety using but a single barrier unit 4. In conventional transmission circuits, where the transmitter is connected by way of a two-wire transmission line, and where neither of the two wires of the transmission line is grounded, it is necessary to provide a safety barrier such as the barrier 4 in each of the two-wire transmission lines.

Thus, there has been provided in accordance with the present invention an improved transmission line interface circuit which provides means whereby both the power supply and the remote transmitter may be grounded circuits and still provide an accurate transmission of data signals.

The embodiments of the invention in which an exclusive property or privilege is claimed are defined as follows:

1. A transmission line interface circuit for interfacing between a remote grounded transmitter and a control room instrument, said interface circuit comprising an operational amplifier having a first and a second input terminal,
    means deriving a first input signal for application to said first input terminal of said operational amplifier, said first input signal being proportional to the current drawn by the transmitter,
    a current control means connected to be responsive to the output of said operational amplifier, and
    means deriving a second input signal for application to said second input terminal of said operational amplifier, said second input signal being proportional to the current drawn by said current control means, said second input signal being applied to said operational amplifier in feedback relation whereby the current controlled by said current control means is a mirror image of the current drawn by said transmitter.

2. The interface circuit as set forth in claim 1 wherein said current control means comprises a transistor amplifier.

3. The interface circuit as set forth in claim 1 characterized by the addition of an intrinsic safety barrier serially connected between said transmitter and said first input to said operational amplifier.

4. A transmission line interface circuit for interfacing between a grounded remote condition signal transmitter and a control room instrumentality, said interface circuit comprising:
    an operational amplifier having a first and a second input terminal and an output terminal,
    a power supply terminal from which current is supplied to the signal transmitter by way of a transmission line,
    means serially connected between said power supply terminal and said transmission line for deriving a first input signal for said operational amplifier proportional to the current supplied to said transmitter,
    means applying said first input signal to said first input terminal of said operational amplifier,
    a current controlling transistor amplifier connected to be responsive to an output signal on the output terminal of said operational amplifier,
    said current controlling transistor amplifier being connected to control the flow of current from said power supply terminal to the control room instrumentality,
    means serially connected between said power supply terminal and said transistor amplifier for deriving a second input signal for said operational amplifier, and
    means applying said second input signal to said second input terminal of said operational amplifier in feedback relation whereby the current supplied to said control room instrumentality through said transistor amplifier is a mirror image of the current drawn by said transmitter.

5. The transmission line interface circuit as set forth in claim 4 wherein said means serially connected between said power supply terminal and said transmission line is a first resistor, and said means serially connected between said power supply terminal and said transistor amplifier is a second resistor substantially equal in value to said first resistor.

6. A transmission line interface circuit for interfacing between a grounded remote condition signal transmitter and a control room instrumentality, said interface circuit comprising:
    an operational amplifier having a first and a second input terminal and an output terminal,
    a power supply terminal from which current is supplied to the signal transmitter by way of a transmission line,
    a first resistor serially connected between said power supply terminal and said transmission line for deriving a first input signal for said operational amplifier proportional to the current supplied to said transmitter,
    means applying said first input signal to said first input terminal of said operational amplifier,
    a current controlling transistor amplifier connected to be responsive to an output signal on the output terminal of said operational amplifier,
    said current controlling transistor amplifier being connected to control the flow of current from said power supply terminal to the control room instrumentality,
    a second resistor substantially equal in value to said first resistor serially connected between said power supply terminal and said transistor amplifier for deriving a second input signal for said operational amplifier, and
    means applying said second input signal to said second input terminal of said operational amplifier in feedback relation whereby the current supplied to said control room instrumentality through said transistor amplifier is equal to the current drawn by said transmitter.

* * * * *